United States Patent
Stout

(10) Patent No.: US 6,414,383 B1
(45) Date of Patent: Jul. 2, 2002

(54) VERY LOW MAGNETIC FIELD INTEGRATED CIRCUIT

(75) Inventor: Darren Lloyd Stout, Moore, OK (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/354,657

(22) Filed: Jul. 16, 1999

(51) Int. Cl.⁷ .............................................. H01L 23/20
(52) U.S. Cl. ....................................... 257/682; 257/630
(58) Field of Search ............................... 257/682, 728, 257/630, 492; H01L 23/20

(56) References Cited

U.S. PATENT DOCUMENTS

| | | | | |
|---|---|---|---|---|
| 4,796,079 A | * | 1/1989 | Hettiger ......................... 357/68 |
| 4,975,762 A | * | 12/1990 | Stradley et al. ................ 357/74 |
| 5,166,772 A | * | 11/1992 | Soldner et al. .............. 257/359 |
| 5,406,117 A | * | 4/1995 | Dlugokecki et al. ......... 257/659 |
| 5,428,242 A | | 6/1995 | Furuya et al. ............... 257/538 |
| 5,446,315 A | * | 8/1995 | Hazaki et al. ............... 257/687 |
| 5,532,514 A | * | 7/1996 | Kozono ....................... 257/728 |
| 5,561,265 A | * | 10/1996 | Livshits et al. ......... 174/35 GC |
| 5,635,754 A | | 6/1997 | Strobel et al. ............... 257/659 |
| 5,808,878 A | * | 9/1998 | Saito et al. .................. 361/818 |
| 5,831,324 A | | 11/1998 | Bang ........................... 257/508 |
| 5,831,489 A | * | 11/1998 | Wire ....................... 333/99.008 |
| 5,872,332 A | | 2/1999 | Verma ...................... 174/35 C |
| 5,880,403 A | | 3/1999 | Czajkowski et al. ...... 174/35 R |
| 5,880,930 A | | 3/1999 | Wheaton ..................... 361/690 |
| 6,097,080 A | * | 8/2000 | Nakanishi et al. .......... 257/659 |
| 6,172,416 B1 | * | 1/2001 | Mjyahara et al. ........... 257/712 |

* cited by examiner

Primary Examiner—Don Wong
Assistant Examiner—Trinh Vo Dinh
(74) Attorney, Agent, or Firm—Fay, Sharpe, Fagan, Minnich & McKee, LLP

(57) ABSTRACT

An integrated electronic device package includes an enclosing structure and a substrate secured within the enclosing structure. At least one first electrical connector protrudes through a first face of the enclosing structure. At least one integrated circuit chip is included within the enclosing structure. The at least one integrated circuit chip is mechanically connected to the substrate and electrically connected to the at least one first electrical connector. Radio-frequency signals are emitted from the at least one integrated circuit chip. A first radiation absorbing device is disposed within the enclosing structure and between the at least one integrated circuit chip and a second face of the enclosing structure.

11 Claims, 2 Drawing Sheets

VERY LOW MAGNETIC FIELD INTEGRATED CIRCUIT

BACKGROUND OF THE INVENTION

The present invention relates to integrated circuit device packages. It finds particular application in conjunction with radio-frequency shielded integrated circuit device packages and will be described with particular reference thereto. It will be appreciated, however, that the invention is also amenable to other like applications.

Integrated circuit devices and/or semiconductor devices find use in a variety of high-density electronics applications. The devices are typically protected from the external environment by transfer molding a thermoset or thermoplastic resin package around the device. The package provides protection from dust, humidity, and other environmental factors that harm and/or destroy delicate circuitry within the device. However, such packages do not prevent various forms of radiation (e.g., radio-frequency ("RF") signals, electromagnetic signals ("EM"), etc.), which are produced by the integrated circuit device, escaping from the package. RF and EM signals, for example, often interfere with other nearby integrated circuit and/or semiconductor devices.

One conventional shielding system is generally characterized by a ferrite material secured to an external surface (e.g., a top surface) of an integrated circuit using an adhesive. The shield acts to reduce the amount of radiation that escapes from the device to which it is attached, thereby avoiding interference with other nearby electronic devices. Also, the shield acts to reduce radiation produced by other nearby devices from interfering with the device to which it is attached. One drawback to this conventional shielding system, however, is that each integrated circuit device in a system often times must be shielded. Furthermore, since the ferrite shielding material is not incorporated into each integrated circuit and/or semiconductor device during the manufacturing process, end-users of the devices often times must manually secure shields to each of the devices within a system. Such steps may be both tedious and time consuming. Also, the shields may represent an unexpected cost to the end-user.

The present invention provides a new and improved apparatus and method which overcomes the above-referenced problems and others.

SUMMARY OF THE INVENTION

An integrated circuit includes a non-metallic casing forming a hollow cavity. At least one first electrical connector extends through a first face of the non-metallic casing. At least one electronic device is secured within the hollow cavity and is capable of producing a radio-frequency energy. At least one second electrical connector electrically connects the at least one electronic device to the at least one first electrical connector. A first shielding material, which is disposed within the hollow cavity between the at least one electronic device and a second face of the non-metallic enclosure, reduces the radio-frequency energy emitted from the non-metallic casing.

One advantage of the present invention is that the amount of radio-frequency and electromagnetic signals emitted from the integrated circuit device is reduced without completely enclosing the integrated circuit device.

Another advantage of the present invention is that the amount of radio-frequency and electromagnetic signals emitted from the integrated circuit device is reduced without the use of external shielding devices.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DESCRIPTION OF THE PREFERRED EMBODIMENTS

Figure 1:
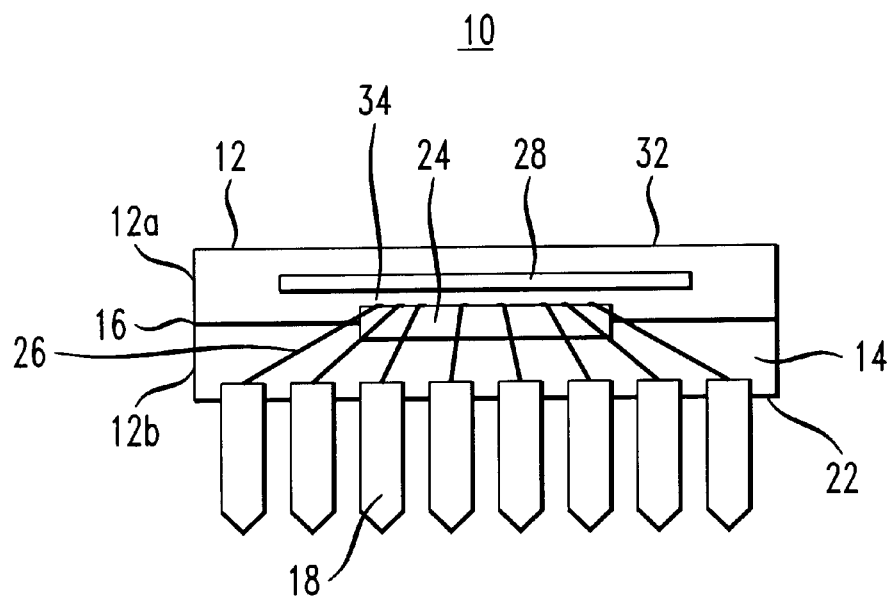
FIG. 1 illustrates a cross-sectional view of a very low magnetic field integrated circuit package according to the present invention.

With reference to FIG. 1, an integrated electronic device package 10 includes an enclosing structure 12 that defines a hollow cavity 14. Preferably, the enclosing structure 12 is not electrically conductive and includes, for example, a plastic material. However, it is to be understood that other materials are also contemplated for the enclosing structure 12. As will be described below the enclosing structure 12 includes two (2) pieces 12a, 12b of the non-conductive material that are secured together.

A substrate 16 is secured within the hollow cavity 14. Electrical connectors 18, which provide external electrical connections to a circuit board (not shown), are secured in and protrude through a first face 22 of the enclosing structure 12. An electronic device 24 is mechanically secured to the substrate 16 and electrically connected to the electrical connectors 18. In the preferred embodiment, the electronic device 24 is an integrated circuit chip. However, it is also contemplated that the electronic device be a semiconductor device. Preferably, the electronic device 24 is electrically connected to the electrical connectors 18 using respective metal solder connection wires 26. However, other types of electrical connections are also contemplated. During use, radiation (e.g., radio-frequency signals and/or electromagnetic signals) are emitted from the electronic device 24.

A first shielding material 28, which acts as a shield for at least some types of the radiation (e.g., radio-frequency signals and/or electromagnetic signals) produced by the electronic device 24, is secured within the enclosing structure 12. The first shielding material 28 is positioned between the electronic device 24 and a second face 32 of the enclosing structure 12. Preferably, an insulator 34 (e.g., an air gap or a non-conductive sheet such as plastic) exists between the first shielding material 28 and the electronic device 24. The insulator 34 prevents the electronic device 24 from being scratched and/or shorted-out by the first shielding material 28.

In the preferred embodiment, the first shielding material 28 includes a radio-frequency absorbing material (e.g., a ferrite material). The radio-frequency absorbing material absorbs at least a portion of the radio-frequency signals and/or electromagnetic signals produced by the electronic device 24. More specifically, the radio-frequency absorbing material 28 receives at least a portion of the radiation produced by the electronic device 24 and converts the radiation to a second form of energy (e.g., heat). The second form of energy does not interfere with electrical operations of other nearby integrated electronic device packages, which may be located on the same circuit board (not shown). Therefore, the amount of radio-frequency energy emitted from the integrated electronic device package 10 is reduced by the amount of radio-frequency energy absorbed by the first shielding material 28.

Figure 2:
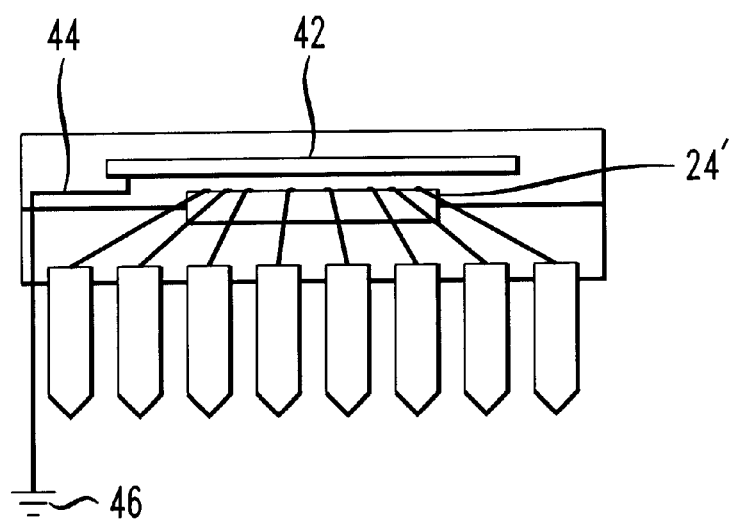
FIG. 2 illustrates a second embodiment of the very low magnetic field integrated circuit package according to the present invention.

FIG. 2 illustrates a second embodiment of the present invention. For ease of understanding this embodiment of the present invention, like components are designated by like numerals with a primed (') suffix and new components are designated by new numerals.

The integrated electronic device package 10' illustrated in FIG. 2 shows a first shielding material 42 including a metal. The metal of the first shielding material 42 receives at least a portion of the radio-frequency energy and/or electromagnetic signals produced by the electronic device 24'. An electrical connection 44 (e.g., a metal wire) electrically connects the first shielding material 42 to an electrical ground 46. Substantially all of the radio-frequency energy received by the first shielding material 42 is transferred to the ground 46 via the electrical connection 44. The ground 46 absorbs substantially all of the transferred radio-frequency energy. Therefore, the amount of radio-frequency energy emitted from the integrated electronic device package 10' is reduced by the amount of radio-frequency energy received by the first shielding material 42.

Figure 3:
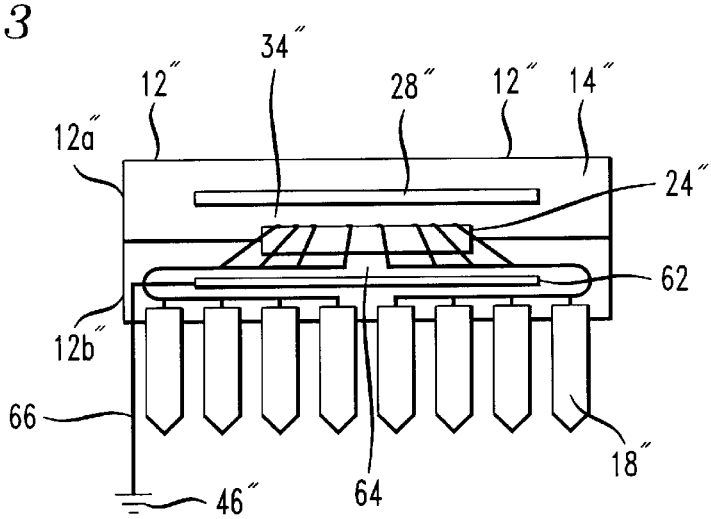
FIG. 3 illustrates a third embodiment of the very low magnetic field integrated circuit package according to the present invention.

FIG. 3 illustrates a third embodiment of the present invention. For ease of understanding this embodiment of the present invention, like components are designated by like numerals with a primed ('') suffix and new components are designated by new numerals.

The integrated electronic device package 10'' illustrated in FIG. 3 includes first and second shielding materials 28'', 62 secured within the hollow cavity 14''. As in the embodiment shown in FIG. 1, the first shielding material 28'' is disposed between the electronic device 24'' and the first face 22'' of the enclosing structure 12''. Preferably, for the reasons discussed above, respective insulators 34'', 64 separate the first and second shielding materials 28'', 62 from the electronic device 24''.

The first shielding material 28'' includes the ferrite material. The second shielding material 62 includes the metal material. An electrical connection 66 (e.g., a metal wire) electrically connects the second shielding material 62 to the ground 46''. As discussed above, the ferrite material of the first shielding material 28'' converts at least a portion of the RF radiation signals emitted from the integrated electronic device package 24'' to a second form of energy, such as heat. Furthermore, as discussed above, the metal material of the second shielding material 62 receives at least a portion of the radio-frequency energy produced by the electronic device 24''. Substantially all of the radio-frequency energy received by the second shielding material 62 is transferred to the ground 46'' via the second shielding material 62 and the electrical connection 66. The ground 46'' absorbs substantially all of the transferred radio-frequency energy. In this manner, the amount of radio-frequency energy emitted from the integrated electronic device package 24'' is reduced by the amount of radio-frequency energy received by the first and second shielding materials 28'', 62, respectively.

Although the first and second shielding materials 28'', 62 illustrated in FIG. 3 include a ferrite material and at least one metal material, respectively, other combinations of materials in the first and second shielding materials are also contemplated. For example, the first shielding material may include the metal material, in which case an electrical connection would connect the first shielding material to the ground. Similarly, the second shielding material may include the ferrite material, in which case no electrical connection would connect the second shielding material to the ground. Furthermore, both the first and second shielding materials may include the ferrite material, in which case neither of the first and second shielding materials would be connected to the ground. Alternatively, both the first and second shielding materials may include the metal material, in which case both the first and second shielding materials would be connected to the ground. In this case, it is also contemplated that the first and second shielding materials include different metal materials.

Figure 4:
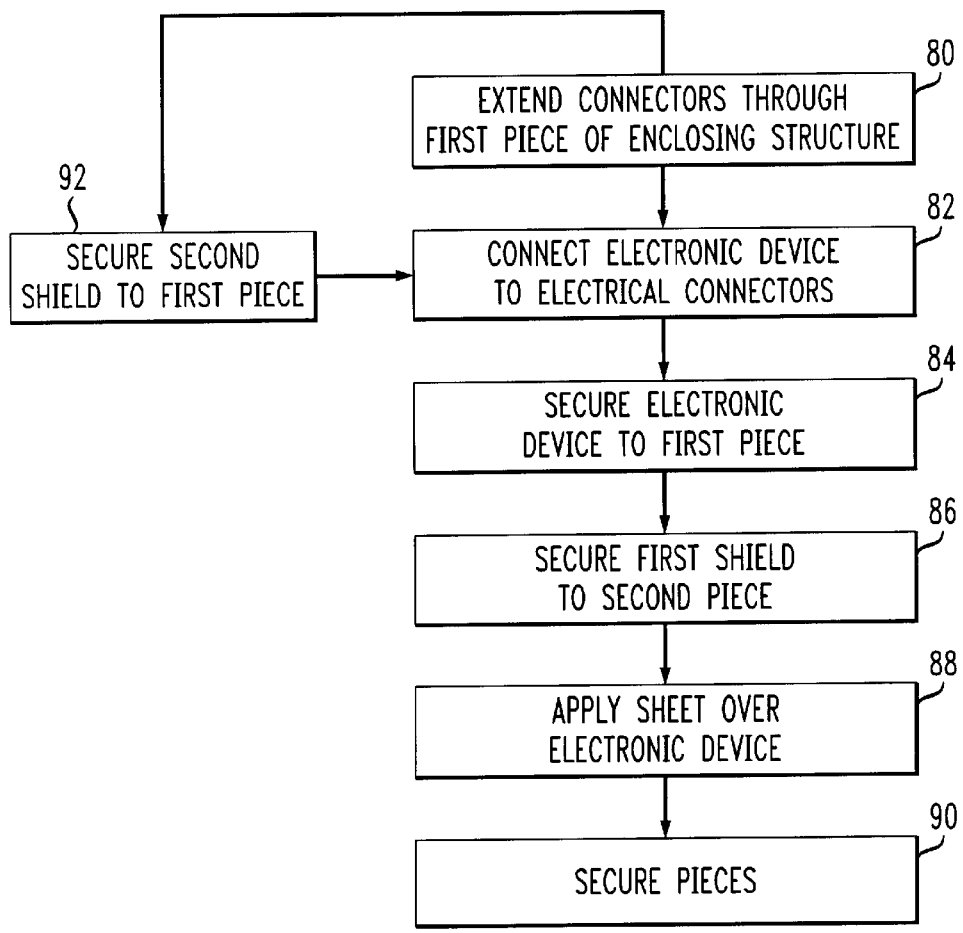
FIG. 4 illustrates steps for manufacturing the very low magnetic field integrated circuit package according to the present invention.

With reference to FIGS. 1 and 4, the integrated electronic device package 10 is fabricated according to the method described below.

The electrical connectors 18 are extended through the first piece 12b of the enclosing structure 12 in a step 80. T he electronic device 24 is electrically connected to the electrical connectors 18 in a step 82. The electronic device 24 is secured to the first piece 12b of the enclosing structure 12 in a step 84. The first shielding material 28 is secured to the second piece 12a of the enclosing structure 12 in a step 86. Optionally, the non-conductive sheet 34 is applied over the electronic device 24 and the metal solder connection wires 26 in a step 88.

The hollow cavity 14 is formed by securing the first and second pieces 12b, 12a, respectively, of the enclosing structure 12 together in a step 90. Securing the first and second pieces 12b, 12a, respectively, causes the electronic device 24 and the first shielding material 28 to be enclosed within the hollow cavity 14. Also, the electronic device 24 and the first shielding material 28 are substantially surrounded by the first and second pieces 12b, 12a, respectively, of the enclosing structure 12. Furthermore, the electronic device 24 is disposed between the first piece 12b of the enclosing structure 12 and the first shielding material 28. As discussed above, the insulator 34 prevents the electronic device 24 from contacting the first shielding material 28.

With reference to FIGS. 3 and 4, the second shielding material 62 is secured to the first piece 12b'' of the enclosing structure 12'' in a step 92. The step 92 occurs after the step 80 of extending the electrical connectors 18'' through the first piece 12b'' of the enclosing structure 12'' is. The second shielding material 62 is disposed within the hollow cavity 14'' and between the electronic device 24'' and the first piece 12b'' of the enclosing structure 12. As discussed above, the insulator 64 (e.g., an air gap or a non-conductive sheet such as plastic) prevents the electronic device 24'' from contacting the second shielding material 62.

The invention has been described with reference to the preferred embodiment. obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. An integrated circuit, comprising:
a non-metallic casing forming a hollow cavity;
at least one first electrical connector extending through a first face of the non-metallic casing;
at least one electronic device, secured within the hollow cavity, capable of producing a radio-frequency energy;
at least one second electrical connector electrically connecting the at least one electronic device to the at least one first electrical connector, and
a first shielding material, which includes ferrite and which is disposed within the hollow cavity between the at least one electronic device and a second face of the non-metallic enclosure, for reducing the radio-frequency energy emitted from the non-metallic casing;
a second shielding material formed of metal disposed within the hollow cavity between the at least one electronic device and the first face of the non-metallic casing; and
a third electrical connector between the second shielding material and a ground, at least a portion of the radio-frequency energy being transferred to the ground via the second shielding material and the third electrical connector, the ground absorbing substantially all of the transferred radio-frequency energy.

2. The integrated circuit as set forth in claim 1, wherein the at least one second electrical connector includes a metal wire.

3. The integrated circuit as set forth in claim 1, wherein an insulator exists between the at least one electronic device and the first shielding material.

4. The integrated circuit as set forth in claim 1, wherein the ferrite material includes at least one of manganese, manganese zinc, and nickel zinc.

5. An integrated electronic device package, comprising:
an enclosing structure;
a substrate secured within the enclosing structure;
at least one first electrical connector protruding through a first face of the enclosing structure;
at least one integrated circuit chip within the enclosing structure, the at least one integrated circuit chip being mechanically connected to the substrate and electrically connected to the at least one first electrical connector, radio-frequency signals being emitted from the at least one integrated circuit chip, and
a first radiation absorbing device, which includes a ferrite material, disposed within the enclosing structure and between the at least one integrated circuit chip and the first face or a second face of the enclosing structure, for reducing the radio-frequency signals emitted from the enclosing structure;
a second radiation absorbing device including an electrically conductive material;
an electrical ground, and
a second electrical connector between the second radiation absorbing device and the electrical ground, at least a portion of the radio-frequency signals being transferred to the electrical ground via the second radiation absorbing device and the second electrical connector, the electrical ground absorbing substantially all of the transferred radio-frequency signals.

6. The integrated electronic device package as set forth in claim 5, wherein a first space separates the at least one integrated circuit chip and the first radiation absorbing device.

7. The integrated electronic device package as set forth in claim 5, wherein a second space separates the at least one integrated circuit chip and the second radiation absorbing device.

8. The integrated electronic device package as set forth in claim 5, wherein the ferrite material includes at least one of manganese, manganese zinc, and nickel zinc.

9. A method for reducing radiation emitted from an integrated circuit, comprising:
causing at least one circuit chip within an enclosing structure around the integrated circuit to emit radiation, at least one first electrical connector extending from a first face of the structure and being electrically connected to the at least one circuit chip; and
absorbing at least a first portion of the radiation with a first radiation absorbing material including a ferrite material located within the enclosing structure and between the at least one circuit chip and the first face or a second face of the enclosing structure;
converting at least the first portion of the radiation into at least one other form of energy,
absorbing at least a second portion of the radiation with a second radiation absorbing material including an electrically conductive material;
receiving at least the second portion of the radiation into the electrically conductive material;
transferring at least the second portion of the radiation from the electrically conductive material to a ground via a third electrical connector, and
absorbing at least the second portion of the radiation into the ground.

10. A method for fabricating a radiation shielded integrated circuit device, comprising:
extending at least one electrical connector through a first piece of a non-conductive material;
electrically connecting at least one electronic device to the at least one electrical connector, the at least one electronic device being capable of producing a radiation energy;
securing the at least one electronic device to the first piece of the non-conductive material;
securing a first shielding material to a second piece of the non-conductive material;
securing the first piece of the non-conductive material to the second piece of the non-conductive material for forming a hollow cavity, the at least one electronic device and the first shielding material being included within the hollow cavity and substantially surrounded by the first and second pieces of the non-conductive material, the at least one electronic device being disposed between the first piece of the non-conductive material and the first shielding material, the at least one electronic device not contacting the first shielding material, and the first shielding material reducing the radiation energy emitted from the first and second pieces of the non-conductive material;
securing a second shielding material to the first piece of the non-conductive material, the second shielding material being disposed within the hollow cavity and between the at least one electronic device and the first piece of the non-conductive material, and the second shielding material not contacting the at least one electronic device,
wherein the radiation energy includes radio-frequency signals, the step of securing the first shielding material including one of:

securing a first ferrite material to the second piece of the non-conductive material, the first ferrite material receiving a first portion of the radio-frequency signals and converting the first portion of the radio-frequency signals to a second form of energy, and securing a first metal material to the second piece of the non-conductive material, the first metal material receiving the first portion of the radio-frequency signals, passing the first portion of the radio-frequency signals to a ground via first additional electrical connectors, and the ground absorbing the first portion of the radio-frequency signals;

wherein the step of securing the second shielding material includes one of:

securing a second ferrite material to the first piece of the non-conductive material, the second ferrite material receiving a second portion of the radio-frequency signals and converting the second portion of the radio-frequency signals to the second form of energy; and securing a second metal material to the first piece of the non-conductive material, the second metal material receiving the second portion of the radio-frequency signals, passing the second portion of the radio-frequency signals to the ground via second additional electrical connectors, and the ground absorbing the second portion of the radio-frequency signals.

11. The method of fabricating a radiation shielded integrated circuit device as set forth in claim 10, further including:

applying a first non-conductive sheet at least over a first side of the at least one electronic device; and applying a second non-conductive sheet at least over a second side of the at least one electronic device, the first and second non-conductive sheets preventing the at least one electronic device from contracting the first and second shielding materials after the step of securing the first and second pieces of the non-conductive material.

* * * * *